United States Patent
Kushihashi et al.

(10) Patent No.: US 6,949,726 B2
(45) Date of Patent: Sep. 27, 2005

(54) HEATING APPARATUS HAVING ELECTROSTATIC ADSORPTION FUNCTION

(75) Inventors: Takuma Kushihashi, Gunma (JP); Yukio Kurosawa, Gunma (JP); Masaki Seki, Gunma (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 0 days.

(21) Appl. No.: 10/923,835

(22) Filed: Aug. 24, 2004

(65) Prior Publication Data

US 2005/0045619 A1 Mar. 3, 2005

(30) Foreign Application Priority Data

Aug. 27, 2003 (JP) .................................... 2003-209136

(51) Int. Cl.⁷ ................................................. H05B 3/16
(52) U.S. Cl. ..................... 219/543; 219/444.1; 219/544
(58) Field of Search ............................ 219/543, 444.1, 219/544; 361/234; 118/724, 725, 728, 730

(56) References Cited

U.S. PATENT DOCUMENTS 5,591,269 A * 1/1997 Arami et al. ............ 118/723 R
5,748,436 A * 5/1998 Honma et al. .............. 361/234

FOREIGN PATENT DOCUMENTS

| JP | 52-67353 | 6/1977 |
| JP | A 59-124140 | 7/1984 |
| JP | A 4-124076 | 4/1992 |
| JP | A 4-358074 | 12/1992 |
| JP | A 5-109876 | 4/1993 |
| JP | A 5-129210 | 5/1993 |
| JP | A 7-10665 | 1/1995 |
| JP | A 2001-189378 | 7/2001 |

OTHER PUBLICATIONS

Watanabe, "Electrostatic Characteristics of Ceramic Electrostatic Chuck," New Ceramics, vol. 7, No. 2, pp. 49–53, 1994.

* cited by examiner

*Primary Examiner*—Robin O. Evans
*Assistant Examiner*—Vinod Patel
(74) *Attorney, Agent, or Firm*—Oliff & Berridge, PLC

(57) ABSTRACT

A heating apparatus having an electrostatic adsorption function comprising at least a supporting substrate, an electrode for electrostatic adsorption and a heating layer formed on the supporting substrate, and an insulating layer formed so as to cover the electrode for electrostatic adsorption and the heating layer, wherein a surface roughness of the insulating layer satisfies Ra≦0.05 μm and Rmax≦0.6 μm, and Vickers hardness of the surface of the insulating layer is 10 GPa or less. Thus, there can be provided a heating apparatus having an electrostatic adsorption function in which scratches are not generated on a silicon wafer or the like and the generation of particles can be suppressed when heating/cooling the wafer or the like.

14 Claims, 1 Drawing Sheet

HEATING APPARATUS HAVING ELECTROSTATIC ADSORPTION FUNCTION

BACKGROUND OF THE INVENTION

1. Field of the Invention

The present invention relates to a heating apparatus having an electrostatic adsorption function, and specifically to a heating apparatus having an electrostatic adsorption function which is used suitably for a heating process of a semiconductor wafer, including a temperature rising process, in the production process and the inspection process of a semiconductor device or the like.

2. Description of the Related Art

Conventionally, a heater where a metal wire is coiled has been used for heating a semiconductor wafer in the production process of a semiconductor device. However, when such a heater is used, there is the problem of metal contamination to the semiconductor wafer. Therefore, in recent years, there was proposed the use of a wafer heating apparatus united with ceramics where a ceramic thin film was used as a heating layer (see Japanese Patent Application Laid-Open (Kokai) No. 4-124076, for example).

Moreover, an electrostatically adsorbing apparatus is used in a reduced pressure atmosphere for fixing a semiconductor wafer on a heater when heating the semiconductor wafer, and the material therefor has shifted to ceramics from resins with a tendency of higher temperature processes (see Japanese Patent Applications Laid-Open (Kokai) No. 52-67353 and No. 59-124140).

Recently, there was proposed wafer heating apparatuses having electrostatic adsorption functions wherein the wafer heating apparatus united with ceramics and the electrostatically adsorbing apparatus are combined. For example, an apparatus wherein alumina is employed for an insulating layer of the electrostatically adsorbing apparatus is used in a low-temperature range such as an etching process (see New ceramics (7), p49–53, 1994.). And an apparatus, wherein silicon nitride, sialon, or aluminum nitride is employed for an insulating layer of the electrostatically adsorbing apparatus (see Japanese Patent Application Laid-Open (Kokai) No. 2001-189378, for example), or pyrolytic boron nitride is employed for an insulating layer of the electrostatically adsorbing apparatus (see Japanese Patent Applications Laid-Open (Kokai) No. 4-358074, No. 5-109876, No. 5-129210, and No. 7-10665), is used in a high temperature range such as a CVD(chemical vapor deposition) process.

Such a heating apparatus having the electric adsorption function is set and used in a semiconductor process chamber. For example, when heating a silicon wafer by using this heating apparatus having the electric adsorption function, first, a silicon wafer is carried into the process chamber with a transfer arm, and the silicon wafer is placed on the heating apparatus having the electrostatic adsorption function.

Next, the silicon wafer is heated by charging a heating layer with electricity while the silicon wafer is adsorbed to the heating apparatus by applying a voltage to an electrode for electrostatic adsorption. After the silicon wafer is heated to a predetermined temperature, processes of annealing and etching, or growing a film by sputtering, CVD or the like are performed.

After the silicon wafer is subjected to desired processes, the power supply for the heating layer is turned off so that the silicon wafer is cooled. After the silicon wafer is cooled to a predetermined temperature, the power supply for the electrode for electrostatic adsorption is turned off, and the silicon wafer are pulled by using a lift pin or the like from the heating apparatus having the electrostatic adsorption function. After that, the silicon wafer is carried outside the process chamber with the transfer arm.

However, in the case of heating/cooling a silicon wafer by using the heating apparatus having the electrostatic adsorption function as described above, since a linear expansion coefficient of the insulating layer of the heating apparatus having the electrostatic adsorption function is different from that of the silicon wafer, each thermal expansion volume and thermal contraction volume of the insulating layer and the silicon wafer are different from each other in a temperature rising and falling process. Thus, they rub against each other.

And, although Vickers hardness of the silicon wafer is about 11 GPa, Vickers hardness of alumina, silicon nitride, sialon, and aluminum nitride, which are used as a material of the insulating layer, are 15 GPa, 16 GPa, 16 GPa, and 14 GPa, respectively. Therefore, in the heating apparatus having the electrostatic adsorption function, wherein alumina, silicon nitride, sialon, or aluminum nitride which are harder than the silicon wafer is used for the insulating layer, there is the problem that the surface of the silicon wafer is ground by the insulating layer when heating/cooling the silicon wafer, then particles are generated, and moreover, scratches are generated on the surface of the silicon wafer. Particularly, in the case that the silicon wafer is heated to a medium and high temperature range of 500–800° C. or a higher temperature range for processing, the difference in thermal expansion volume between the insulating layer and the silicon wafer is further increased, so the particles are further easily generated, and moreover, the scratches are remarkably generated on the surface of the silicon wafer, so that the flatness of the silicon wafer is degraded.

And, as described above, if the particles are generated in the processes such as annealing and etching, it causes the generation of pattern defects and the like in the subsequent device fabrication process, and leads to various problems such as lowering device yield and degrading reliability of devices.

On the other hand, in the case of the heating apparatus having the electrostatic adsorption function, which uses pyrolytic boron nitride for the insulating layer, pyrolytic boron nitride has small Vickers hardness of 2 GPa, which is softer than the silicon wafer. Therefore, there are few cases that the surface of the silicon wafer is ground by the insulating layer when heating/cooling the silicon wafer as described above. But on the contrary, there is the problem that the surface of the insulating layer is ground by the silicon wafer, so that the particles are generated as in the above.

SUMMARY OF THE INVENTION

The present invention has been accomplished to solve the above-mentioned problems. An object of the present invention is to provide a heating apparatus having an electrostatic adsorption function in which scratches are not generated on a silicon wafer or the like and the generation of particles can be suppressed when heating/cooling the wafer and the like.

In order to accomplish the above object, according to the present invention, there is provided a heating apparatus having an electrostatic adsorption function, comprising at least a supporting substrate, an electrode for electrostatic adsorption and a heating layer formed on the supporting substrate, and an insulating layer formed so as to cover the electrode for electrostatic adsorption and the heating layer, wherein a surface roughness of the insulating layer satisfies Ra≦0.05 μm and Rmax≦0.6 μm, and Vickers hardness of the surface of the insulating layer is 10 GPa or less.

As described above, in the heating apparatus having an electrostatic adsorption function comprising at least a supporting substrate, an electrode for electrostatic adsorption, a heating layer, and an insulating layer, if an average surface roughness of the insulating layer satisfies Ra≦0.05 μm and a maximum surface roughness thereof satisfies Rmax≦0.6 μm, and Vickers hardness of the surface of the insulating layer is 10 GPa or less, since Vickers hardness of the insulating layer is smaller than that of a silicon wafer, for example, the silicon wafer is not ground by the insulating layer even though they rub against each other due to the difference in each thermal expansion when heating/cooling the silicon wafer. Moreover, since there are only a few and small protrusions on the surface of the insulating layer, there can be provided a heating apparatus having an electrostatic adsorption function in which the generation of scratches on the wafer surface and the insulating layer can be prevented and the generation of particles can be suppressed.

In this case, it is preferable that the insulating layer consists of pyrolytic boron nitride or pyrolytic boron nitride containing carbon.

If the insulating layer consists of pyrolytic boron nitride, since Vickers hardness of pyrolytic boron nitride is smaller than that of the silicon wafer, the silicon wafer is not ground by the insulating layer even though they rub against each other when heating/cooling the silicon wafer, and therefore, the generation of scratches and particles due to grinding the silicon wafer can be surely prevented. And, if the insulating layer consists of pyrolytic boron nitride containing carbon, since Vickers hardness of pyrolytic boron nitride containing carbon is smaller than that of the silicon wafer, but larger than that of pure pyrolytic boron nitride, that is, can be closer to that of the silicon wafer, the generation of scratches on the wafer can be prevented, and since the insulating layer is difficult to be ground, the generation of particles can be further suppressed.

Further, it is preferable that the insulating layer has a thickness of 50–500 μm.

If the insulating layer of the heating apparatus has such a thickness, sufficient electrostatic adsorption power can be obtained without the generation of dielectric breakdown when applying a voltage to the electrode for electrostatic adsorption, and therefore, the wafer can be stably adsorbed electrostatically.

Moreover, it is preferable that the electrode for electrostatic adsorption and the heating layer are formed on a protective layer formed on the supporting substrate.

As described above, if the electrode for electrostatic adsorption and the heating layer are formed on a protective layer formed on the supporting substrate, contamination due to impurities, gases, and so on contained in the supporting substrate can be surely prevented.

In this case, the protective layer consists of pyrolytic boron nitride.

If the protective layer consisting of pyrolytic boron nitride is formed on the supporting substrate, the protective layer can be stable even in a high temperature, and do not exfoliate.

And, it is preferable that the supporting substrate consists of any one of a silicon nitride sintered body, a boron nitride sintered body, a mixed sintered body of boron nitride and aluminum nitride, an alumina sintered body, an aluminum nitride sintered body, and graphite.

If the supporting substrate consists of such a material, since it is excellent in physical properties such as heat resistance and strength, there can be obtained the heating apparatus possible to use stably for a long time.

Moreover, it is preferable that the electrode for electrostatic adsorption and/or the heating layer consist of any one of gold, the platinum group, silver, a mixture of gold or the platinum group and silver, titanium, tungsten, tantalum, molybdenum, pyrolytic graphite, and pyrolytic graphite containing boron and/or boron carbide.

If the electrode for electrostatic adsorption consists of the above materials, the electrode can be easily formed and the wafer can be electrostatically adsorbed suitably. Moreover, if the heating layer consists of the above materials, the heating layer can be easily formed and the heat generation can be performed efficiently without causing troubles such as a thermal deformation, a disconnection, and a short circuit.

Moreover, it is preferable that the electrode for electrostatic adsorption and/or the heating layer are formed by screen printing or chemical vapor deposition.

If the electrode for electrostatic adsorption and/or the heating layer are formed by screen printing or chemical vapor deposition, they can be formed in a desired thickness uniformly on the supporting substrate or the protective layer. And moreover, the bonding strength between the electrode for electrostatic adsorption or the heating layer and the supporting substrate (or the protective layer) and the bonding strength between the electrode for electrostatic adsorption or the heating layer and the insulating layer formed thereon can get further strong.

As explained above, according to the heating apparatus having an electrostatic adsorption function of the present invention, even when a silicon wafer is subjected to the device fabrication process or the like in a medium and high temperature range of 500–800° C., for example, scratches are not generated on the surface of the silicon wafer, and the generation of particles can be suppressed. Therefore, by using the heating apparatus having the electrostatic adsorption function of the present invention, the reliability and yield of a semiconductor device in the device fabrication process and the like can be extremely improved.

DESCRIPTION OF THE INVENTION AND EMBODIMENT

The embodiments of the present invention will now be described. However, the invention is not limited thereto.

Figure 1:
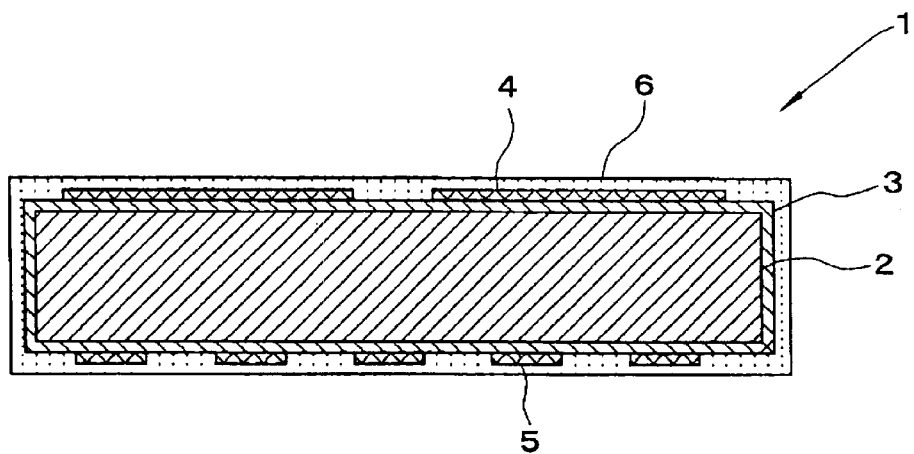
FIG. 1 is a schematic sectional view showing an example of a heating apparatus having an electrostatic adsorption function according to the present invention.

FIG. 1 is a schematic sectional view showing an example of a heating apparatus having an electrostatic adsorption function of the present invention. In the heating apparatus having an electrostatic adsorption function 1, an electrode for electrostatic adsorption 4 and a heating layer 5 are formed on a protective layer 3 formed on a supporting substrate 2 having a circular plate shape. Moreover, an insulating layer 6 is formed so as to cover the electrode for electrostatic adsorption 4 and the heating layer 5. Additionally, although not shown, a power feeding terminal for the electrostatic adsorption and a power feeding terminal for the heating layer for the connection to an external power supply are provided with the electrode for electrostatic adsorption 4 and the heating layer 5, respectively, and electricity is supplied through the terminals to each of them.

When heating a semiconductor wafer and the like, by supplying electricity from the power feeding terminal for the electrostatic adsorption and the power feeding terminal for the heating layer provided with the electrode for electrostatic adsorption 4 and the heating layer 5, respectively, the semiconductor wafer can be adsorbed and fixed on the insulating layer 6 on the front surface of the supporting substrate 2 by the electrode for electrostatic adsorption 4, and the wafer can be heated by the conductive heating layer 5 on the back surface of the supporting substrate 2.

Hereinafter, each component of the heating apparatus 1 having an electrostatic adsorption function of the present invention will be explained specifically.

First, although the material of the supporting substrate 2 is not limited particularly, it is preferable that the supporting substrate 2 consists of any one of silicon nitride sintered body, boron nitride sintered body, mixed sintered body of boron nitride and aluminum nitride, alumina sintered body, aluminum nitride sintered body, and graphite. If the supporting substrate 2 consists of such a material, since each material is inexpensive and has excellent physical properties such as heat resistance and strength, there can be desirably obtained the heating apparatus possible to use stably for a long time even when heating/cooling is repeated in the medium and high temperature range of 500–800° C., for example.

The shape of the supporting substrate 2 is not limited particularly, and besides the circular plate shape as described above, it may be a polygonal plate shape, a cylindrical shape, a shape of a circular plate or a cylinder with concave or convex portions, or the like.

Figure 2:
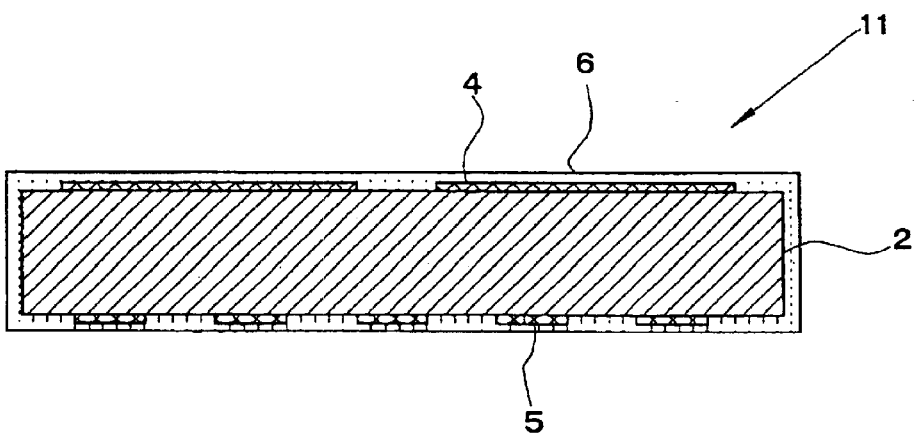
FIG. 2 is a schematic sectional view showing another example of a heating apparatus having an electrostatic adsorption function according to the present invention.

And, as shown in FIG. 1, if the protective layer 3 is formed on the supporting substrate 2, it can be prevented that impurities, out gases and the like contained in the supporting substrate 2 may adversely affect the subsequent fabrication process. Such a protective layer 3 is essential to secure the insulation performance and also necessary to prevent the oxidation in the case that the supporting substrate 2 consists of graphite, for example. On the other hand, in the case that the supporting substrate 2 consists of an insulating material and the like, there can be provided a heating apparatus 11 having an electrostatic adsorption function without forming the protective layer 3 as shown in FIG. 2, for example. However, the contamination due to impurities and the like contained in the sintered body as described above, for example, can be surely prevented if the protective layer 3 is formed.

It is preferable that the material of the protective layer 3 has stability up to a high temperature. Silicon nitride, boron nitride, alumina, aluminum nitride, pyrolytic boron nitride, and the like can be given as examples. Particularly, when the protective layer 3 consists of pyrolytic boron nitride, it is preferable because the protective layer is stable up to high temperature of 1500° C. or more. Further, as to the thickness of the protective layer 3, if the layer is too thick, the exfoliation occurs easily due to the difference in thermal expansion between the supporting substrate and the protective layer, and if the layer is too thin, impurities, gases and the like pass through pin holes of the layer, which may adversely affect the subsequent fabrication process. Therefore, it is desirable that the protective layer is formed with the thickness of about 10–300 $\mu$m, in particular, about 30–150 $\mu$m.

Also, although each material of the electrode for electrostatic adsorption 4 and the heating layer 5 is not limited particularly, it is preferable that the electrode for electrostatic adsorption 4 and the heating layer 5 consist of any one of gold, the platinum group, silver, a mixture of gold or the platinum group and silver, titanium, tungsten, tantalum, molybdenum, pyrolytic graphite, and pyrolytic graphite containing boron and/or boron carbide. For example, if the electrode for electrostatic adsorption 4 consists of such materials, since the electrode can be easily formed and an electrostatic adsorption power is high in a middle and high temperature range, a wafer can be electrostatically adsorbed suitably. Further, if the heating layer 5 consists of the materials as described above, the heating layer can be easily formed and the heat generation can be performed efficiently without causing troubles such as a thermal deformation, a disconnection, and a short circuit.

Although each thickness of the electrode for electrostatic adsorption 4 and the heating layer 5 is not limited particularly, it is desirably 10–300 $\mu$m, in particular, 30–150 $\mu$m. By forming the electrode for electrostatic adsorption and the heating layer having the thicknesses of this range, an object to be heated such as a semiconductor wafer can be electrostatically adsorbed suitably and heated effectively.

And as to the insulating layer 6 formed so as to cover the electrode for electrostatic adsorption 4 and the heating layer 5, an average surface roughness satisfies Ra$\leq$0.05 $\mu$m and a maximum surface roughness satisfies Rmax$\leq$0.6 $\mu$m, and Vickers hardness of the surface of the insulating layer is 10 GPa or less.

As described above, if the surface roughness of the insulating layer satisfies Ra$\leq$0.05 $\mu$m and Rmax$\leq$0.6 $\mu$m, there are only a few and small protrusions on the surface of the insulating layer to be in contact with a silicon wafer, and thereby, even if the wafer and the insulating layer rub against each other due to the difference in each thermal expansion when heating/cooling the wafer, each of the wafer and the insulating layer is difficult to be ground each other, and thus generation of particles can be suppressed.

Also, since Vickers hardness of the surface of the insulating layer is 10 GPa or less, which is less than that of a silicon wafer, even if they rub against each other when heating/cooling the silicon wafer, the silicon wafer is not ground, and thus, generation of scratches on the wafer surface can be surely prevented. In addition, if the Vickers hardness of the surface of the insulating layer is too small, it is considered that since the insulating layer is soft, generation of the particles can not be sufficiently suppressed even when the surface roughness of the insulating layer is controlled as described above. Therefore, it is preferable that the Vickers hardness of the surface of the insulating layer is 0.5 GPa or more.

In this case, it is preferable that the insulating layer 6 has the thickness of 50–500 $\mu$m, in particular, 100–200 $\mu$m. If the insulating layer 6 has the thickness of less than 50 $\mu$m, there is a possibility that dielectric breakdown occurs in the insulating layer. On the other hand, if the insulating layer has the thickness of more than 500 $\mu$m, there is a possibility that sufficient electrostatic adsorption power can not be obtained.

Also, it is preferable that the insulating layer 6 consists of pyrolytic boron nitride or pyrolytic boron nitride containing carbon. For example, in the case of using pyrolytic boron nitride as a material of the insulating layer 6, Vickers hardness of pyrolytic boron nitride is about 2 GPa in general, which is smaller than that of a silicon wafer (generally 11 GPa). Therefore, even in the case that the insulating layer and the silicon wafer rub against each other when heating/ cooling the silicon wafer, particles and scratches generated by the silicon wafer being ground can be surely prevented.

And, if the insulating layer consists of pyrolytic boron nitride containing carbon, Vickers hardness of pyrolytic boron nitride containing carbon is about 3 GPa, which is smaller than that of a silicon wafer, but larger than that of pure pyrolytic boron nitride, i.e., can be closer to that of the silicon wafer. Therefore, generation of scratches on the wafer surface can be surely prevented, and moreover, since the insulating layer is difficult to be ground, generation of particles can be further suppressed.

It is considered that the reason why the above effect can be obtained by including carbon in pyrolytic boron nitride is that the crystal structure of pyrolytic boron nitride is disordered by including carbon in pyrolytic boron nitride, and as a result, cleavability, which pyrolytic boron nitride originally has, is spoiled to be a further hardened material.

Hereinafter, experimental results of the investigation about the relation between the surface roughness of the insulating layer and the amount of particles generated when heating/cooling a silicon wafer in the heating apparatus having an electrostatic adsorption function are shown.

Experiment:

As an insulating layer 6 of a heating apparatus 1 having an electrostatic adsorption function as shown in FIG. 1, several kinds of heating apparatuses having an electrostatic adsorption function, having different surface roughness within the range of 0.03 $\mu$m$\leq$Ra$\leq$0.07 $\mu$m and 0.4 $\mu$m$\leq$Rmax$\leq$0.8 $\mu$m on each insulating layer consisting of pyrolytic boron nitride containing carbon, were prepared. In this case, each Vickers hardness of the surfaces of the insulating layers was 3 GPa.

Several kinds of heating apparatuses having the electrostatic adsorption function having different surface roughness on each insulating layer were set in a vacuum chamber respectively, and after a silicon wafer having a diameter of 200 mm was placed on each heating apparatus, voltages were applied to each electrode for electrostatic adsorption of the heating apparatuses and each heating layer was electrically charged, and each silicon wafer was heated to 800° C. and cooled while adsorbing each silicon wafer at an adsorption power of 3 g/cm. After the silicon wafers were cooled, the silicon wafers were taken out from the vacuum chamber. After that, each surface (adsorbed surface) of the silicon wafers which had been heated/cooled by each heating apparatus was measured by a particle counter, and the number of particles having the size of 0.2 $\mu$m or more was counted. The measured results are shown in Table 1 as follows.

TABLE 1

| Samples | Surface roughness of insulating layer | | Number of particles having the size of 0.2 $\mu$m or more |
|---|---|---|---|
| | Ra ($\mu$m) | Rmax ($\mu$m) | (numbers) |
| Experiment 1 | 0.03 | 0.6 | 5900 |
| Experiment 2 | 0.05 | 0.6 | 7000 |
| Experiment 3 | 0.07 | 0.6 | 12900 |

TABLE 1-continued

| Samples | Surface roughness of insulating layer | | Number of particles having the size of 0.2 $\mu$m or more |
|---|---|---|---|
| | Ra ($\mu$m) | Rmax ($\mu$m) | (numbers) |
| Experiment 4 | 0.04 | 0.4 | 6000 |
| Experiment 5 | 0.04 | 0.6 | 6500 |
| Experiment 6 | 0.04 | 0.8 | 13400 |

As shown in Table 1, when Experiments 1–3 are compared, in the case that the surface roughness of the insulating layer satisfied Ra>0.05 $\mu$m (Experiment 3), the number of particles having the size of 0.2 $\mu$m or more measured on the wafer surface was extremely increased. And, from Experiments 4–6, it is found that when the surface roughness of the insulating layer satisfied Rmax>0.6 $\mu$m (Experiment 6), a large number of particles were generated even where Ra was 0.05 $\mu$m or less. In addition, there was no scratch on any adsorbed surfaces of the silicon wafers in Experiments 1–6.

From the above experimental results, it can be confirmed that if the surface roughness of the insulating layer satisfies Ra$\leq$=0.05 $\mu$m and Rmax$\leq$=0.6 $\mu$m, and Vickers hardness thereof is 10 GPa or less, particles generated when heating/cooling the wafer can be decreased.

As described above, according to the heating apparatus having an electrostatic adsorption function of the present invention, there is provided the heating apparatus having an electrostatic adsorption function in which even if the insulating layer and the silicon wafer rub against each other when heating/cooling the silicon wafer or the like in a medium and high temperature range of 500–800° C., for example, the silicon wafer is not ground, so that particles generated from the silicon wafer and the generation of scratches on the wafer surface can be surely prevented and the generation of particles by the insulating layer being ground can be suppressed. Therefore, by using the heating apparatus having the electrostatic adsorption function of the present invention in the device fabrication process and the like, the heating apparatus can greatly contribute to the improvement of reliability and yield of a semiconductor device.

In addition, the heating apparatus having the electrostatic adsorption function of the present invention is effective if the surface roughness of the insulating layer satisfies Ra$\leq$0.05 $\mu$m and Rmax$\leq$0.6 $\mu$m, and Vickers hardness of the surface of the insulating layer is 10 GPa or less as mentioned above, and therefore, when it is necessary to form an insulating layer having Vickers hardness larger than that of a silicon wafer, by further forming a surface layer having Vickers hardness of 10 GPa or less on the insulating layer and controlling the surface roughness of the surface layer within the above range, there can also be provided the heating apparatus in which scratches are not generated on the silicon wafer and the generation of particles can be suppressed.

Next, a production method of the heating apparatus having the electrostatic adsorption function as described above will be explained specifically. However, the present invention is not limited thereto.

First, a protective layer 3 is formed on a supporting substrate 2 as needed. For example, in the case of using a supporting substrate consisting of graphite, a protective layer consisting of pyrolytic boron nitride can be formed on the supporting substrate consisting of graphite by reacting a mixed gas of ammonia and boron trichloride under a predetermined temperature and a predetermined pressure.

Subsequently, an electrode for electrostatic adsorption 4 and a heating layer 5 are formed. The electrode for electrostatic adsorption 4 and the heating layer 5 can be easily formed by screen printing or chemical vapor deposition. In the case of forming an electrode for electrostatic adsorption and a heating layer consisting of pyrolytic graphite by chemical vapor deposition for example, it is possible that a pyrolytic graphite layer is formed on the protective layer by reacting a methane gas under the condition of 1000–2500° C. and 1–10 Torr, and subsequently a pattern of the electrode for electrostatic adsorption 4 is processed in the pyrolytic graphite layer on the front surface of the supporting substrate and the pattern of the heating layer 5 is processed in the pyrolytic graphite layer on the back surface thereof.

As described above, according to the chemical vapor deposition, the electrode for electrostatic adsorption and the heating layer can be formed uniformly on the supporting substrate or the protective layer with a desired thickness and a high adhesiveness, and the bonding strength between the electrode or the heating layer and the insulating layer formed thereon is further strengthened. And, in the case of forming the electrode for electrostatic adsorption and the heating layer by the screen printing, a high bonding strength between the electrode or the heating layer and the insulating layer can be obtained as in the chemical vapor deposition and additionally, it is not necessary to perform a pattern processing for the electrode for electrostatic adsorption and the heating layer, so that there is an advantage that the production processes can be reduced, and thus, the electrode for electrostatic adsorption and the heating layer can be easily formed.

In addition, as aforementioned, since there are some cases that the protective layer is not needed depending on the material of the supporting layer or the like, it is possible to form the electrode for electrostatic adsorption 4 and the heating layer 5 directly on the supporting substrate 2, as in the heating apparatus 11 having the electrostatic adsorption function shown in FIG. 2.

Next, an insulating layer 6 is formed on the electrode for electrostatic adsorption 4 and the heating layer 5. Then, Vickers hardness of the surface of the insulating layer is adjusted to 10 GPa or less, which is surely less than that of a silicon wafer (generally about 11 GPa). Generally, Vickers hardness of the insulating layer depends on the material and formation method thereof, or the like. Therefore, in order to adjust Vickers hardness of the surface of the insulating layer to 10 GPa or less, the material and formation method of the insulating layer can be properly selected, and if the insulating layer having Vickers hardness of 10 GPa or less can be formed, the formation method thereof is not limited particularly, and thus, the formation method suitable for the material can be used.

For example, in the case that the material of the insulating layer 6 is pyrolytic boron nitride as aforementioned, the insulating layer can be preferably formed by chemical vapor deposition using the material gases for forming pyrolytic boron nitride. For example, if the chemical vapor deposition is performed with the gases of ammonia and boron halide under the condition of 1600–2000° C. and 5–100 Torr, the insulating layer consisting of pyrolytic boron nitride in which Vickers hardness of the surface is 10 GPa or less can be easily formed.

Also, in the case that the material of the insulating layer 6 is pyrolytic boron nitride containing carbon, by chemical vapor deposition using a mixed gas of the material gases for forming pyrolytic boron nitride and gases containing carbon, the insulating layer can be preferably formed. For example, the chemical vapor deposition is performed with the gases of ammonia, boron halide, and methane under the condition of 1600–2000° C. and 5–100 Torr, the insulating layer consisting of pyrolytic boron nitride containing carbon in which Vickers hardness of the surface is 10 GPa or less can be easily formed.

And, after the insulating layer having Vickers hardness of 10 GPa or less is formed as described above, the surface of the insulating layer is subjected to surface grinding, mirror polishing and the like, and thereby, the insulating layer has the surface roughness of Ra≦0.05 μm and Rmax≦0.6 μm. In this case, processing conditions of the surface grinding or the mirror polishing are not limited particularly, and it is possible to perform the grinding and the polishing under the proper condition so that the surface roughness of the insulating layer is within the above ranges.

According to the above production methods, there can be produced an heating apparatus having an electrostatic adsorption function comprising at least a supporting substrate, an electrode for electrostatic adsorption and a heating layer formed on the supporting substrate, and an insulating layer formed so as to cover the electrode for electrostatic adsorption and the heating layer, wherein a surface roughness of the insulating layer satisfies Ra≦0.05 μm and Rmax≦0.6 μm, and Vickers hardness of the surface of the insulating layer is 10 GPa or less.

EXAMPLES

Hereinafter, the present invention will be explained specifically with reference to Examples and Comparative Example. However, the present invention is not limited thereto.

Example 1

First, a graphite substrate having a diameter of 200 mm and a thickness of 15 mm was prepared as a supporting substrate, and the reaction of a mixed gas of ammonia and boron trichloride was performed thereto under the condition of 1800° C. and 100 Torr to form a protective layer consisting of pyrolytic boron nitride on the supporting substrate.

Next, methane gas was pyrolyzed on the protective layer under the condition of 2200° C. and 5 Torr to form a pyrolytic graphite layer having a thickness of 100 μm. Subsequently, the front surface of the pyrolytic graphite layer was processed into an electrode pattern to form an electrode for electrostatic adsorption, and the back surface thereof was processed into a heater pattern to form a heating layer.

After the electrode for electrostatic adsorption and the heating layer were formed, the reaction of a mixed gas of the gas containing ammonia and boron trichloride with methane was further performed under the condition of 2000° C. and 100 Torr to form an insulating layer consisting of pyrolytic boron nitride containing carbon having a thickness of 200 μm. Thereby, a heating apparatus having an electrostatic adsorption function was manufactured. After that, an electrostatically adsorbing surface of the heating apparatus having the electrostatic adsorption function was subjected to surface grinding and mirror polishing, so that the insulating layer had a surface roughness of Ra=0.05 μm and Rmax=0.6 μm.

After thus-obtained heating apparatus having the electrostatic adsorption function was set in the vacuum chamber and a silicon wafer having a diameter of 200 mm was placed on the heating apparatus, a voltage was applied to the electrode for electrostatic adsorption and the heating layer was electrically charged, then the silicon wafer was heated to 800° C. and cooled while adsorbing the silicon wafer at an adsorption power of 3 g/cm. After the silicon wafer was cooled, the silicon wafer was taken out from the vacuum chamber.

After that, the adsorbed surface of the silicon wafer was measured by the particle counter, and the number of particles having the size of 0.2 μm or more was counted. As a result, the number of the particles on the surface of the silicon wafer was 7000. Also, the surface of the silicon wafer was observed by the optical microscope, and no scratch to be generated by rubbing against the surfaces of the wafer and the insulating layer was observed on the wafer surface.

Moreover, after the wafer surface was observed, a sample was cut from the insulating layer of the heating apparatus having the electrostatic adsorption function to measure Vickers hardness of the insulating layer. As a result, it was found that the insulating layer had Vickers hardness of 3 GPa.

Example 2

First, a graphite substrate having a diameter of 200 mm and a thickness of 15 mm was prepared as a supporting substrate, and a protective layer consisting of pyrolytic boron nitride was formed on the supporting substrate as in the above Example 1, and subsequently, an electrode for electrostatic adsorption and a heating layer were formed on the protective layer. After the electrode for electrostatic adsorption and the heating layer were formed, the reaction of a gas containing ammonia and boron trichloride was performed under the condition of 1800° C. and 100 Torr to form an insulating layer consisting of pyrolytic boron nitride having a thickness of 200 μm. Thereby, a heating apparatus having an electrostatic adsorption function was manufactured. After that, an electrostatically adsorbing surface of the heating apparatus having the electrostatic adsorption function was subjected to surface grinding and mirror polishing, so that the insulating layer had a surface roughness of Ra=0.01 μm and Rmax=0.1 μm.

After thus-obtained heating apparatus having the electrostatic adsorption function was set in the vacuum chamber and a silicon wafer having a diameter of 200 mm was placed on the heating apparatus, the silicon wafer was heated to 800° C. and cooled while adsorbing the silicon wafer at an adsorption power of 3 g/cm, as in the above Example 1. After the silicon wafer was cooled, the silicon wafer was taken out from the vacuum chamber. After that, an adsorbed surface of the silicon wafer was measured by the particle counter, and the number of particles having the size of 0.2 μm or more was counted. As a result, the number of the particles on the surface of the silicon wafer was 10000. Also, the surface of the silicon wafer was observed by the optical microscope, and as a result, no scratch was observed on the wafer surface.

Moreover, after the wafer surface was observed, Vickers hardness of the insulating layer was measured. As a result, it was found that the insulating layer had Vickers hardness of 2 GPa.

Comparative Example

First, a graphite substrate having a diameter of 200 mm and a thickness of 15 mm was prepared as a supporting substrate, and a protective layer consisting of pyrolytic boron nitride was formed on the supporting substrate as in the above Example 2, and subsequently, an electrode for electrostatic adsorption and a heating layer were formed on the protective layer. After the electrode for electrostatic adsorption and the heating layer were formed, the reaction of a gas containing ammonia and boron trichloride was performed under the condition of 1800° C. and 100 Torr to form an insulating layer consisting of pyrolytic boron nitride having a thickness of 200 μm as in the above Example 2. Thereby, a heating apparatus with an electrostatically adsorbing function was manufactured. After that, an electrostatic adsorption surface of the heating apparatus having the electrostatic adsorption function was subjected to the polishing with #600 sandpaper, so that the insulating layer had a surface roughness of Ra=0.3 μm and Rmax=2.8 μm.

After thus-obtained heating apparatus having the electrostatic adsorption function was set in the vacuum chamber and a silicon wafer having a diameter of 200 mm was placed on the heating apparatus, the silicon wafer was heated to 800° C. and cooled while adsorbing the silicon wafer at an adsorption power of 3 g/cm. After the silicon wafer was cooled, the silicon wafer was taken out from the vacuum chamber. After that, the adsorbed surface of the silicon wafer was measured by the particle counter and the number of particles having the size of 0.2 μm or more was counted. As a result, the number of the particles on the surface of the silicon wafer was 25000. Also, the surface of the silicon wafer was observed, and as a result, no scratch was observed. But traces ground were observed on the surface of the insulating layer.

Moreover, after the wafer surface was observed, Vickers hardness of the insulating layer was measured. As a result, it was found that the insulating layer had Vickers hardness of 2 GPa.

The present invention is not limited to the above-described embodiments. The above-described embodiments are mere examples, and those having the substantially same structure as that described in the appended claims and providing the similar action and effects are included in the scope of the present invention.

For example, as for the heating apparatus having the electrostatic adsorption function of the present invention, the shapes of the electrode for electrostatic adsorption and the heating layer in addition to the supporting substrate are not limited to those shown in FIGS. 1 and 2.

What is claimed is:

1. A heating apparatus having an electrostatic adsorption function, comprising at least a supporting substrate, an electrode for electrostatic adsorption and a heating layer formed on the supporting substrate, and an insulating layer formed so as to cover the electrode for electrostatic adsorption and the heating layer, wherein a surface roughness of the insulating layer satisfies Ra≦0.05 μm and Rmax≦0.6 μm, and Vickers hardness of the surface of the insulating layer is 10 GPa or less wherein Ra is the average surface roughness and Rmax is the maximum surface roughness.

2. The heating apparatus having an electrostatic adsorption function according to claim 1, wherein the insulating layer consists of pyrolytic boron nitride or pyrolytic boron nitride containing carbon.

3. The heating apparatus having an electrostatic adsorption function according to claim 2, wherein the insulating layer has a thickness of 50–500 μm.

4. The heating apparatus having an electrostatic adsorption function according to claim 2, wherein the electrode for electrostatic adsorption and the heating layer are formed on a protective layer formed on the supporting substrate.

5. The heating apparatus having an electrostatic adsorption function according to claim 4, wherein the protective layer consists of pyrolytic boron nitride.

6. The heating apparatus having an electrostatic adsorption function according to claim 2, wherein the supporting substrate consists of any one of a silicon nitride sintered body, a boron nitride sintered body, a mixed sintered body of boron nitride and aluminum nitride, an alumina sintered body, an aluminum nitride sintered body, and graphite.

7. The heating apparatus having an electrostatic adsorption function according to claim 2, wherein the electrode for electrostatic adsorption and/or the heating layer consist of any one of gold, the platinum group, silver, a mixture of gold or the platinum group and silver, titanium, tungsten, tantalum, molybdenum, pyrolytic graphite, and pyrolytic graphite containing boron and/or boron carbide.

8. The heating apparatus having an electrostatic adsorption function according to claim 2, wherein the electrode for electrostatic adsorption and/or the heating layer are formed by screen printing or chemical vapor deposition.

9. The heating apparatus having an electrostatic adsorption function according to claim 1, wherein the insulating layer has a thickness of 50–500 μm.

10. The heating apparatus having an electrostatic adsorption function according to claim 1, wherein the electrode for electrostatic adsorption and the heating layer are formed on a protective layer formed on the supporting substrate.

11. The heating apparatus having an electrostatic adsorption function according to claim 10, wherein the protective layer consists of pyrolytic boron nitride.

12. The heating apparatus having an electrostatic adsorption function according to claim 1, wherein the supporting substrate consists of any one of a silicon nitride sintered body, a boron nitride sintered body, a mixed sintered body of boron nitride and aluminum nitride, an alumina sintered body, an aluminum nitride sintered body, and graphite.

13. The heating apparatus having an electrostatic adsorption function according to claim 1, wherein the electrode for electrostatic adsorption and/or the heating layer consist of any one of gold, the platinum group, silver, a mixture of gold or the platinum group and silver, titanium, tungsten, tantalum, molybdenum, pyrolytic graphite, and pyrolytic graphite containing boron and/or boron carbide.

14. The heating apparatus having an electrostatic adsorption function according to claim 1, wherein the electrode for electrostatic adsorption and/or the heating layer are formed by screen printing or chemical vapor deposition.

* * * * *